United States Patent [19]
Rostoker

[11] Patent Number: 5,818,102
[45] Date of Patent: Oct. 6, 1998

[54] SYSTEM HAVING INTEGRATED CIRCUIT PACKAGE WITH LEAD FRAME HAVING INTERNAL POWER AND GROUND BUSSES

[75] Inventor: Michael D. Rostoker, Boulder Creek, Calif.

[73] Assignee: LSI Logic Corporation, Milpitas, Calif.

[21] Appl. No.: 580,800

[22] Filed: Dec. 29, 1995

[51] Int. Cl.⁶ .................................................. H01L 23/495
[52] U.S. Cl. .......................... 257/666; 257/669; 257/692
[58] Field of Search .................................. 257/691, 666, 257/692, 700

[56] References Cited

U.S. PATENT DOCUMENTS

| | | | |
|---|---|---|---|
| 3,881,175 | 4/1975 | Wanless | 340/173 SP |
| 3,909,838 | 9/1975 | Beyerlein | 357/70 |
| 4,587,548 | 5/1986 | Grabbe et al. | 357/70 |
| 4,608,592 | 8/1986 | Miyamoto | 357/80 |
| 4,903,114 | 2/1990 | Aoki et al. | 357/70 |
| 4,987,473 | 1/1991 | Johnson | 357/70 |
| 5,025,114 | 6/1991 | Braden | 174/52.4 |
| 5,096,852 | 3/1992 | Hobson | 437/207 |
| 5,105,257 | 4/1992 | Michii | 257/691 |
| 5,138,430 | 8/1992 | Gow, 3rd et al. | 357/70 |
| 5,168,368 | 12/1992 | Gow, 3rd et al. | 257/666 |
| 5,218,229 | 6/1993 | Farnworth | 257/676 |
| 5,229,639 | 7/1993 | Hansen et al. | 257/666 |
| 5,258,575 | 11/1993 | Beppu et al. | 174/52.4 |
| 5,311,058 | 5/1994 | Smolley | 357/691 |
| 5,386,141 | 1/1995 | Liang et al. | 257/691 |
| 5,498,901 | 3/1996 | Chillara et al. | 257/666 |

FOREIGN PATENT DOCUMENTS

| | | | |
|---|---|---|---|
| 62-31132 | 2/1987 | Japan | 257/666.2 |
| 63-253635 | 10/1988 | Japan . | |
| 63-299370 | 12/1988 | Japan . | |
| 1-44027 | 2/1989 | Japan | 257/666.2 |
| 6-104369 | 4/1994 | Japan | 257/666.2 |

*Primary Examiner*—Tom Thomas
*Assistant Examiner*—Roy Potter
*Attorney, Agent, or Firm*—Katz & Cotton, LLP

[57] ABSTRACT

An electronic system utilizing at least one integrated circuit including a semiconductor integrated circuit chip housed in a package providing external electrical connections for the circuit chip. The system package has only a limited number of external connections available for such use. The system package includes an internal buss, or plurality of busses, which are electrically connected to the circuit chip and to selected external connections or the package to improve the efficiency of utilization of external connections on the package, as well as improving operating characteristics of the integrated circuit chip by improvements to voltage and current distributions to the chip, and also eliminating in some cases the consequences of a poor quality of external electrical connection to the system package itself.

11 Claims, 6 Drawing Sheets

SYSTEM HAVING INTEGRATED CIRCUIT PACKAGE WITH LEAD FRAME HAVING INTERNAL POWER AND GROUND BUSSES

CROSS REFERENCE TO RELATED PATENT APPLICATION

This patent application is related to commonly owned U.S. patent application Ser. No. 08/056,337, filed Apr. 30, 1993, entitled "INTEGRATED CIRCUIT WITH LEAD FRAME PACKAGE HAVING INTERNAL POWER AND GROUND BUSSES," by Chok J. Chia.

BACKGROUND OF THE INVENTION

1. Field of the Invention

The present invention relates generally to electronic systems utilizing semiconductor integrated circuits and, more particularly, an electronic system comprised of at least one an integrated circuit having a lead frame package with internal busses for power distribution and grounding.

2. Description of the Related Technology

Integrated circuits are generally mounted in lead frame packages which provide both environmental protection to the semiconductor chip on which the small-scale portion of the integrated circuit is formed, as well as providing for electrical connection of the integrated circuit chip to external circuitry. With large scale integrated circuits having the necessity for a multitude of external electrical connections, the physical limitations of the lead frame package limits the performance of the integrated circuit which may be housed within a particular size of package. This packaging limitation also significantly increases the cost of the integrated circuit by necessitating an increase in the size of the integrated circuit chip itself beyond that which would otherwise be required. This size increase of the integrated circuit chip is necessary simply to allow for the limitations of the packaging technology. In the pertinent art, the limitations imposed by the chip packaging is referred to as an I/O (input-output) limitation on chip interconnectivity.

To further elaborate, the lead frame package generally includes a base which is square in plan view and which carries a lead frame. At the periphery of the base, this lead frame provides depending legs each forming a separate electrical contact for the integrated circuit. A typical lead frame package might include fifty-two contact legs along each side edge of the package for a total of 208 contacts. The lead frame includes a plurality of lead fingers each extending from a respective contact leg radially inwardly across the base toward the integrated circuit semiconductor chip. Because the semiconductor circuit chip is small in size compared with the size of the package, the lead fingers taper to become narrower in width and also to become closer together as they approach the integrated circuit chip. In plan view this plurality of lead frame fingers appears like a star burst surrounding the integrated circuit chip.

Such lead frames are generally stamped or chemically etched from sheet material for convenience and economy of manufacture. With a standard lead finger thickness of 0.15 mm, present technology in the production of the lead frames limits the lead finger pitch (center-to-enter dimension of the lead fingers) to 0.2 mm. A similar limitation applies to the minimum width of each lead frame finger. Consequently, with each certain number of lead frame contacts and lead frame fingers, there is a technology-limited minimum size of the area bounded by the inner ends of the lead frame fingers and within which the integrated chip itself can be mounted.

Further, the contact pads of the semiconductor integrated circuit chip are generally connected to the inner ends of the lead frame fingers using fine-dimension wire conductors, hereinafter "bond wires." The length of these bond wires are themselves technology limited to a maximum of about 4.5 mm. Consequently, there results a minimum size for the semiconductor chip dependent on the number of contact pads thereon. If the semiconductor chip is made smaller than this minimum size, it cannot be connected to external circuitry because of the limitations of the lead frame and bond wire technologies. That is, the lead frame fingers and bond wires cannot reach the small integrated circuit with the large number of such fingers and bond wires required.

As is easily understood, the necessity of making a semiconductor chip larger than would otherwise be required has great cost disadvantages both in terms of material and facilities utilization. Particularly, an integrated circuit chip which is physically larger than required decreases the number of chips which may be formed on each semiconductor wafer, and decreases the yield of chips from each wafer which is processed through the manufacturing facilities.

Still further, a typical integrated circuit chip may have as many as twenty percent, or more, of its contact pads devoted just to the supplying of power and ground connections to the integrated circuit. Because conventional practice uses one of the lead frame fingers for each one of the contact pads of the integrated circuit chip, a considerable part of the electrical connection capacity of the package is devoted to simply providing power and ground connections to the integrated circuit.

OBJECTS OF THE INVENTION

In view of the above, an object of this invention is to provide an electronic system utilizing an integrated circuit housed in a lead frame package and with an improved number of contact pads for the integrated circuit which are connected externally via the lead frame package.

An other object for the present invention is to improve the performance and usefulness of the lead frame package with a view to the number of integrated circuit contact pads which can be connected with a particular size of lead frame package in an electronic system.

Additionally, an objective for the present invention is to provide an electronic system utilizing a lead frame package with an internal buss structure adjacent to the integrated circuit chip.

Still another objective of the present invention is to provide an electronic system utilizing a lead frame package of the above-described character wherein the internal buss structure is particularly adapted to provide power distribution and grounding within the lead frame package adjacent to the integrated circuit chip.

SUMMARY OF THE INVENTION

The present invention provides for an electronic system utilizing at least one integrated circuit with a lead frame package having a base upon which is mounted an integrated circuit chip with a plural contact pads electrically connecting with respective peripheral contacts of the base, a lead frame extending radially across the base and outwardly connecting with the contacts of the base while inwardly connecting with the contact pads of the integrated circuit chip, the lead frame including plural spaced apart conductive lead frame fingers tapering radially inwardly between the contacts of the base and the contact pads of the integrated circuit chip, and the lead frame fingers cooperatively carrying a peripheral conductive buss adjacent to and circumscribing the integrated circuit chip.

It is contemplated that the method and apparatus of the present invention may be utilized in system level products comprising single chip modules (SCM) often including other electrical components (such as capacitors, resistors, inductors, etc.); multi-chip modules (MCM) having at least two integrated circuit dice in the same or separate resin and/or substrate board packages, with or without other electrical components; board level products (BLP) such as those having multiple integrated circuits on printed wiring board(s) (PWB); and box level products (Boxes) which may include a combination of elements from the list of SCM, MCM, BLP and the like. One or more of such SCM, MCM, PWB or BLP's may act as, or be integrated into a functional system or subsystem. The system level products contemplated include digital (or other) data storage systems; security and surveillance systems, general purpose computers (such as personal computers, work stations, servers, mini computers, mainframe computers and super computers); digital audio and video compression and transmission systems; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications systems (such as PBX telephone switching, voice mail, auto attendant, network controllers, video teleconferencing, digital data transmission (such as token ring, ethernet, ATM, or the like), and including subsystems or subassemblies for inclusion or attachment to more complex system level products.

Other objects, features and advantages of the invention will become apparent when taken with the drawings in light of the following description thereof.

DETAILED DESCRIPTION OF THE PREFERRED EMBODIMENTS

Figure 1:
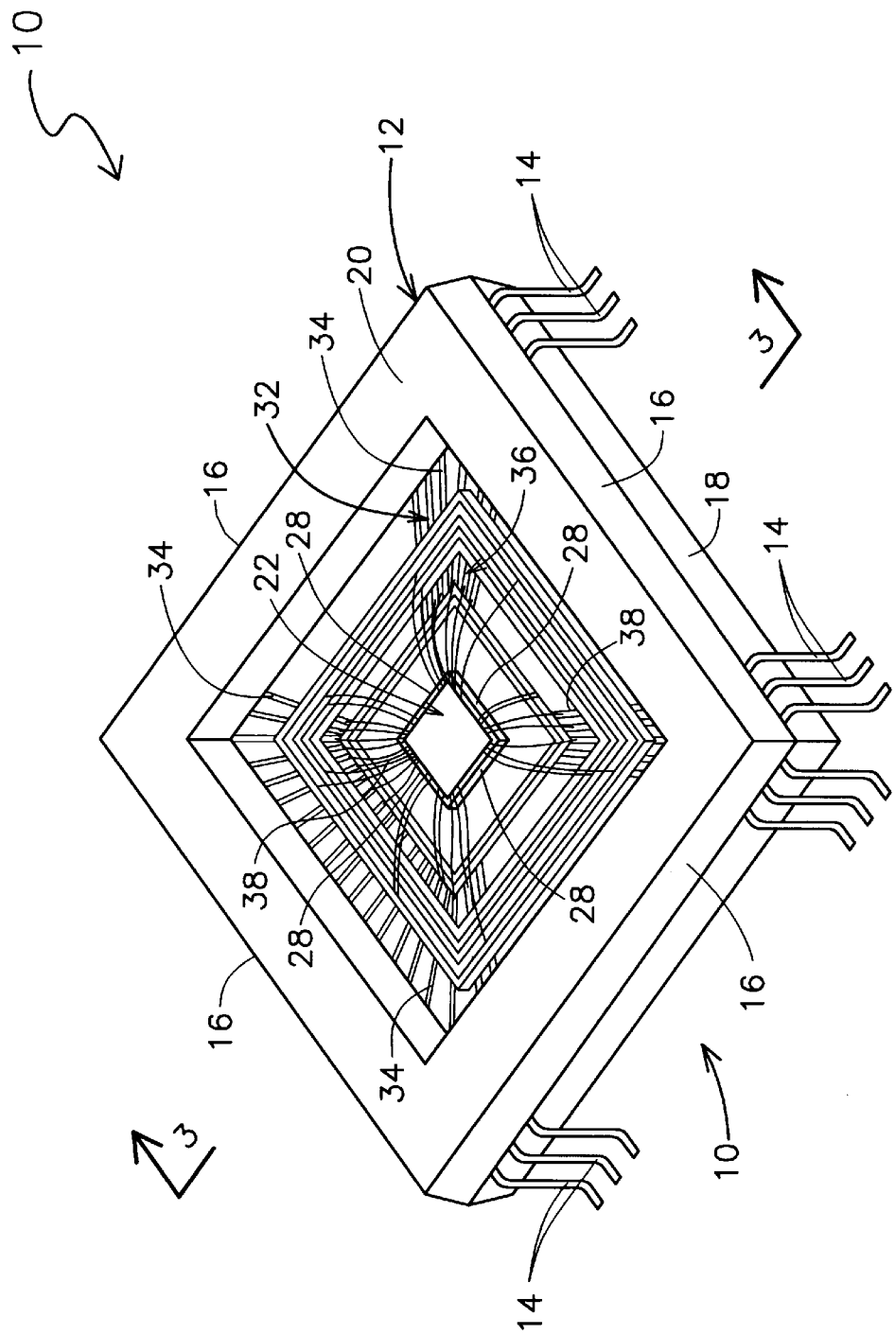
FIG. 1 provides a perspective view of an integrated circuit which includes an integrated circuit chip and a quad package, the package being partially broken away to better illustrate internal structure of the integrated circuit and its package as used in an electronic system.

Referring now to the drawings, the details of preferred embodiments are schematically illustrated. Like elements are numbered the same, and similar elements are represented by the same number and a different lower case letter suffix. FIG. 1 perspectively illustrates an integrated circuit 10 which includes a comparatively thin square package 12, which is generally referred to as a "quad package," because it includes electrical contact legs 14 extending from all four edges 16 of the package 12. By way of example only and without limitation, the package 12 may include 52 contact legs at each edge 16 so that a total of 208 contacts are available for external electrical connections with the integrated circuit 10. This package 12 includes a base portion 18 from which the contacts 14 depend, and a cover or top portion 20 overlying the base portion 18 as well as an integrated circuit chip 22 mounted thereon. In FIG. 1, a central part of the top portion 20 has been broken away to better depict the integrated circuit chip 22, as well as other structure of the package 12 adjacent to the chip.

Figure 2:
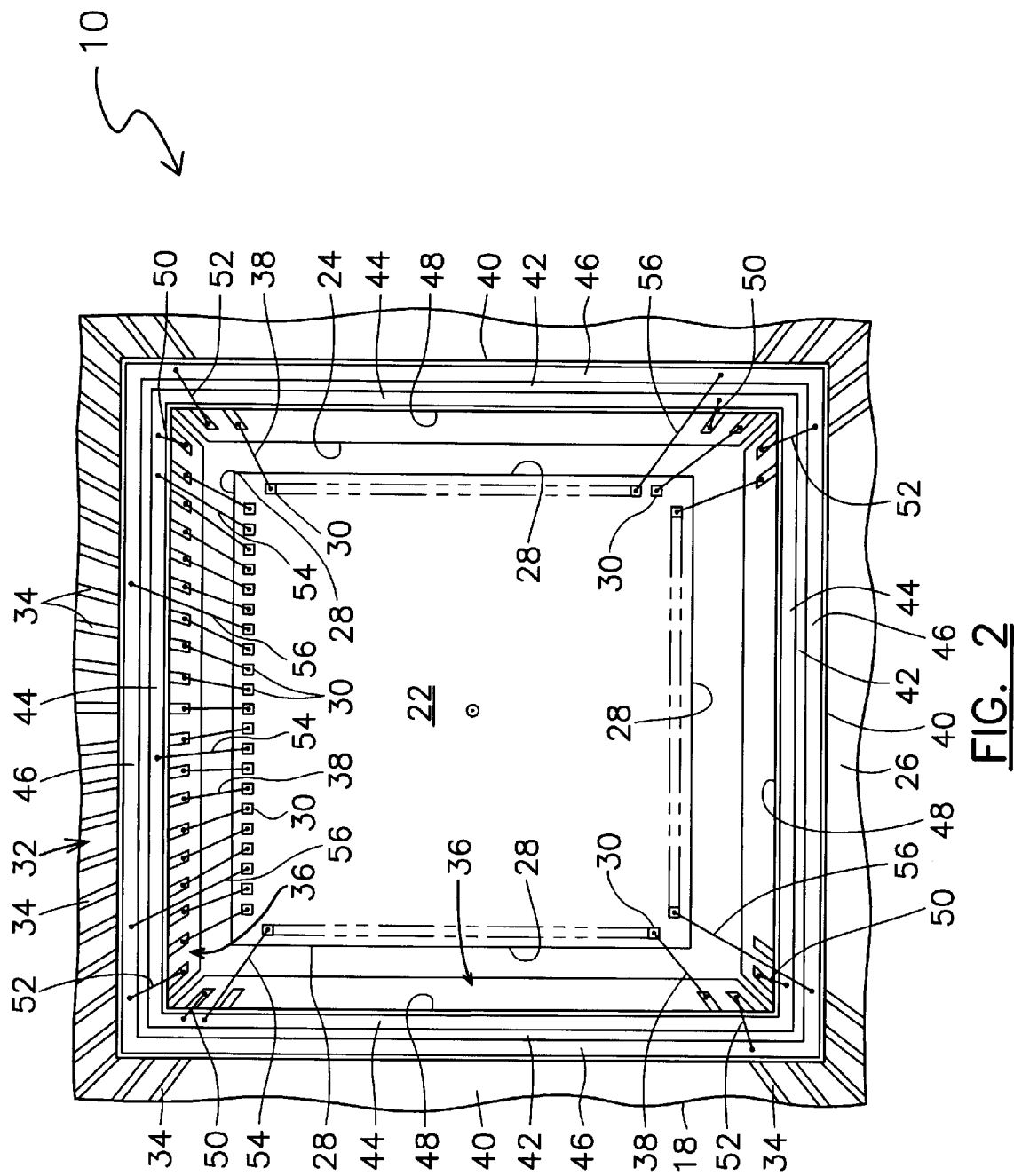
FIG. 2 provides an enlarged plan view of the internal structure of the quad package in the vicinity of the integrated circuit chip, and also with parts of the package broken away to better illustrate details of the structure.
Figure 3:
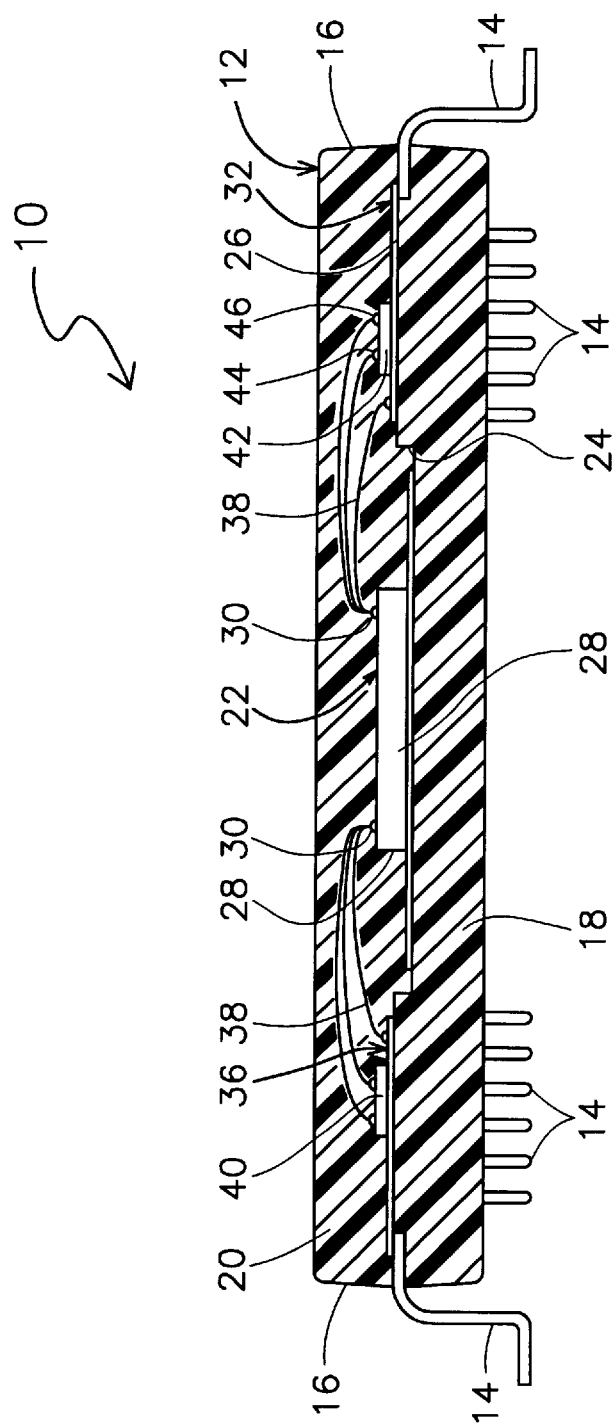
FIG. 3 shows a fragmentary cross sectional view taken along a line 3—3 of FIG. 2.

As mentioned, generally in the center of the base portion 18 the integrated circuit chip 22 is secured (best seen by viewing FIG. 2). This integrated circuit is comparatively small, generally on the order of one-fourth of an inch on each side, and is also square in plan view and comparatively thin. The package 12 will generally be about an inch on each side so that there is a considerable difference between the size of the package 12 and the circuit chip 22. The circuit chip 22 is mounted in a shallow recess 24, so that the chip is surrounded by a plateau 26 (seen in FIG. 3) extending outwardly toward the edges 16 of the base portion 18 where contact legs 14 are disposed. Adjacent to side edges 28 of the circuit chip 22 the latter includes a plurality of contact pads 30. For ease of illustration in the drawing Figures, the number of contact pads 30 and of contact legs 14 have been considerably reduced. However, the structure depicted is representative of the actual physical structure of an integrated circuit chip and its package.

In order to electrically connect the contact pads 30 of the circuit chip 22 with respective ones of the contact legs 14 on the base 18, the latter carries a lead frame 32 extending across the plateau 26. The lead frame 32 includes a plurality of spaced-apart and fanned-out tapering conductive lead fingers 34 which are equal in number with and connect at their outer ends (not shown) to the contact legs 14. As the lead fingers extend from the contact legs 14 inwardly across plateau 26, they necessarily taper to become narrower and also to become closer together. FIG. 2 depicts only the inner end portions 36 of the lead fingers 34. These lead fingers 34 extend toward but end short of the contact pads 30 of the circuit chip 22.

During manufacture of the integrated circuit 10, the circuit chip 22 and lead frame 32 are each secured to the base portion 18 of the package 12, and plural fine-dimension bond wires 38 are secured at their inner ends to respective contact pads 30 of the circuit chip 22. These fine-dimension bond wires 38 are also secured at their outer ends to respective inner end portions 36 of the led fingers 34 in order to complete the electrical connections between the contact legs 14 and the contact pads 30.

In order to protect and maintain the relative positions of the lead fingers 34 of the lead frame 32, an open-centered square 40 of insulative polymer film material is adhesively secured to the lead fingers immediately outside of the inner end portions 36 thereof. Preferably, this open-centered square 40 may be made of polyimide material, and may be provided with a pressure-sensitive, contact, temperature curing, or catalyzed adhesive to secure it to the lead fingers 34. This open-centered square 40 of film material circumscribes the circuit chip 22, and assists in locating the inner end portions 36 of the lead fingers during manufacture operations, including placement of the bond wires 38.

Importantly, this open-centered square 40 of film material also carries on an upper surface 42 thereof, away from the underlying lead fingers 34, a pair of spaced-apart circumferential bus conductors 44 and 46. These bus conductors are disposed adjacent to an inner edge 48 of the square 40, and immediately outwardly of the inner portions 36 of the lead fingers. By way of example, the buss conductors 44 and 46 may be formed on the upper surface 42 of the film material by plating or printing. However, the buss conductors 44 and 46 are connected to respective ones of the lead fingers 34 which according to the exemplary embodiment carry respective power and ground connections to the chip 22 from external circuitry.

As is illustrated in FIG. 2, the power buss 44 is connected by a bond wires 50 in each of the four quadrants thereof to one of the lead fingers 34 in the same quadrant of the package 12 which carries power to the chip 22. This arrangement of conductors ensures a desirable distribution of voltage drops and current flows in the power buss 44. Similarly, the ground buss 46 is connected to the grounded lead fingers by wire bond conductors 52. Particular contact pads of the integrated circuit chip 22 which require that either power or ground connection be supplied thereto are connected to the power buss 44 or to the ground buss 46 by respective wire bond conductors 54 and 56, rather than to an individual lead finger 34. Thus, the number of lead fingers which are required for the conducting of power to the chip 22 can be reduced to four, for example. If desired, the number of lead fingers carrying power to the chip 22 could even be reduced to one. Similarly, the grounding connection to the chip 22 can also be reduced to a single lead finger, if desired.

As set out above, a conventional integrated circuit generally requires a considerable number of power and ground connections to the integrated circuit chip thereof. Conventionally, these power and ground connections may preempt as much as twenty percent or more of the lead fingers. For example, with a lead frame package of 208 contacts, as many as forty-two, or more of the lead fingers may be conventionally used to supply power and ground connections to the integrated circuit. These power and ground connections will generally be distributed around the perimeter of the integrated circuit. Thus, only 166, or fewer, of the lead fingers are available to connect other functions to the integrated circuit chip.

However, with the same package of 208 contacts, the present invention allows as many as 206 of the lead frame fingers to be used for the functions other than power supply and grounding, an improvement in packaging utilization of over twenty-four percent. Even if the internal power and grounding busses are each provided with two lead frame finger connections in each quadrant, as might be desirable in order to achieve voltage drop and current distribution objectives in the busses, for a total of eight lead frame fingers so utilized, the improvement over the conventional example of using only 166 of the fingers for other functions is better than twenty percent.

Another advantageous consideration with the present invention is that the operational characteristics of the integrated circuit chip itself may be improved by the package having power and ground busses therein. That is, the voltage distribution uniformity or current availability to various ones of the contact pads of the integrated circuit chip may be improved by the present invention. The ground and power busses 44 and 46 each immediately circumscribe the integrated circuit chip 22, and the contact pads 30 thereof. Consequently, the voltage level uniformity and current availability to the contact pads of the circuit chip should be improved by the present invention, with a commensurate improvement in the operation of the circuit chip. Also, the consequences of a less-than-perfect power or ground connection between one of the contact legs 14 and the board (not shown) upon which the integrated circuit 10 is mounted should be decreased by the present invention. With a conventional integrated circuit, such a weak connection can seriously decrease the operational ability of a portion of the circuit chip 22. However, with the present invention, so along as the other power and ground connections are adequate, operation of the circuit chip 22 should not be affected.

Many other combinations of features, some of which have been expressly set forth hereinabove, are within the spirit and scope of this invention and may be advantageously utilized in SCM, MCM and BLP systems as contemplated herein.

System level products may be designed and fabricated in various forms. A system level product may, for example, include a single chip modules ("SCM") having a single semiconductor die in a single package body, with or without other electrical components, such as capacitors. System level products may also include multi-chip modules ("MCM") having two or more semiconductor dies in the same or separate package bodies, with or without other electrical components. System level products may also include board level products ("BLP"), such as those having one or more semiconductor devices on one or more printed wiring boards. Box level products ("Boxes") are also system level products which may include a combination of SCMs, MCMs, BLPs, and/or other devices. One or more of such SCMs, MCMs, BLPs or Boxes may act as, or be integrated into, a functional system or subsystem or the like.

System level products can be employed to carry out numerous applications and in various environments. For example, system level products may include:

(a) digital data (or other memory) storage systems;

(b) security and surveillance systems;

(c) general purpose computers, such as personal computers, work stations, severs, mini computers, mainframe computers and super computers;

(d) digital audio, video compression and transmission systems;

(e) transportation vehicles, such as airplanes, trains, automobiles, helicopters, rockets, missiles, boats, submarines, and the like, as well as subsystems utilized in transportation vehicles, which include positioning systems (for example, global positioning systems), navigational displays and controllers, hazard avoidance systems (such as radar and sonar), fly by wire control systems and engine controlling and monitoring systems;

(f) entertainment systems, such as digital television, audio cameras, video recorders, compact disc players/recorders, and digital tape or other audio systems;

(g) communication systems, such as traditional or cellular telephones, private branch exchanges ("PBX"), telephone switches, voice processing systems (such as voice mail systems), network controllers, video teleconferencing equipment and digital data transmission systems or encoder/decoders (as are ordinarily used in conjunction with, for example, bus networks, token ring networks, star networks and ethernet networks); and (h) subsystems or subassemblies for inclusion or attachment to more complex system level products.

In an SCM, a single semiconductor die is packaged and adapted for connection to external systems. This usually involves mounting the die to some sort of substrate, lead frame or carrier, connecting the bond pads on the die to some sort of conductive leads or traces and forming a package body around the die. The conductive leads or traces exit the package body, and usually terminate in external leads, pins or solder balls.

Figure 4:
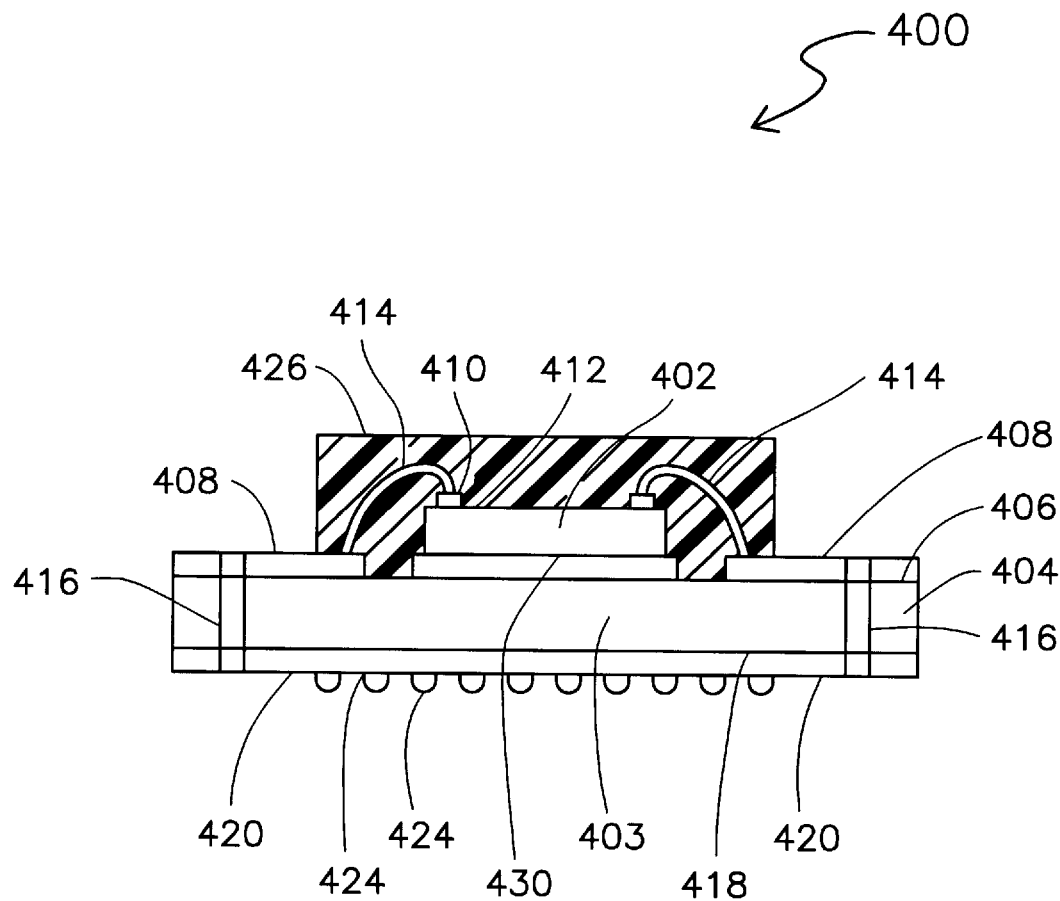
FIG. 4 is a schematic elevational view of a single chip module illustrated in cross section.

Referring to FIG. 4, an elevational view of a SCM is illustrated in cross section. The SCM 400, as illustrated, is a ball bump grid array semiconductor package. A semiconductor die 402 is mounted to the top surface of a central area 403 of a substrate 404. The semiconductor die has conductive lines 412 formed thereon (not illustrated). The top surface 406 of the substrate 404 is provided with a number of conductive traces 408 that extend from near the periphery of the substrate 404 to the central area 403. The die 402 has bond pads 410 thereon. Bond wires 414 extend from the bond pads 410 to inner ends of the traces 408. Near the periphery of the substrate 404, there are plated (conductive) through-holes (vias) 416 extending from the bottom surface 418 of the substrate 404, through the substrate to a respective trace 408. The bottom surface 418 of the substrate is provided with a number of conductive traces 420, each having an end connected with a respective via 416. In this manner, signals (and power) to and from the die are connected through the bond wires 414, through the top side traces 408, through the vias 416, to the bottom side traces 420. Solder balls 424 are attached to the traces 420. A package body 426 is formed over the die, and partially covers the top surface of the substrate 404.

Pin grid array semiconductor packages, chip carriers (leaded or leadless), flat packs (such as plastic quad gullwing flat packs), ceramic packages and small outline integrated circuits are also examples of SCMs. Numerous other examples, designs and types of SCMs are known to those of ordinary skill in the art of semiconductor integrated circuit packages.

When two or more semiconductor dies are mounted in the same or separate package body, with or without other electrical components, the resulting assembly is typically referred to as a multi-chip module (MCM).

In order to connect to one of the two or more semiconductor dies of a MCM, a substrate having conductive traces (like substrate 404 of FIG. 4) is often used. Additional components such as capacitors, resistors and inductors may be mounted to the substrate. Often, the interconnections between the various components mounted to the substrate necessitate a large number of conductive traces which need to cross one another. In such cases, it is known to provide a substrate, having alternating layers of insulating material (such as fiberglass, teflon, FR4, BT resin, and the like) and conductive trace patterns (typically formed of metal foils, such as copper). The conductive traces from one layer are typically connected to the conductive traces of another layer by plated through-holes or vias.

Figure 5:
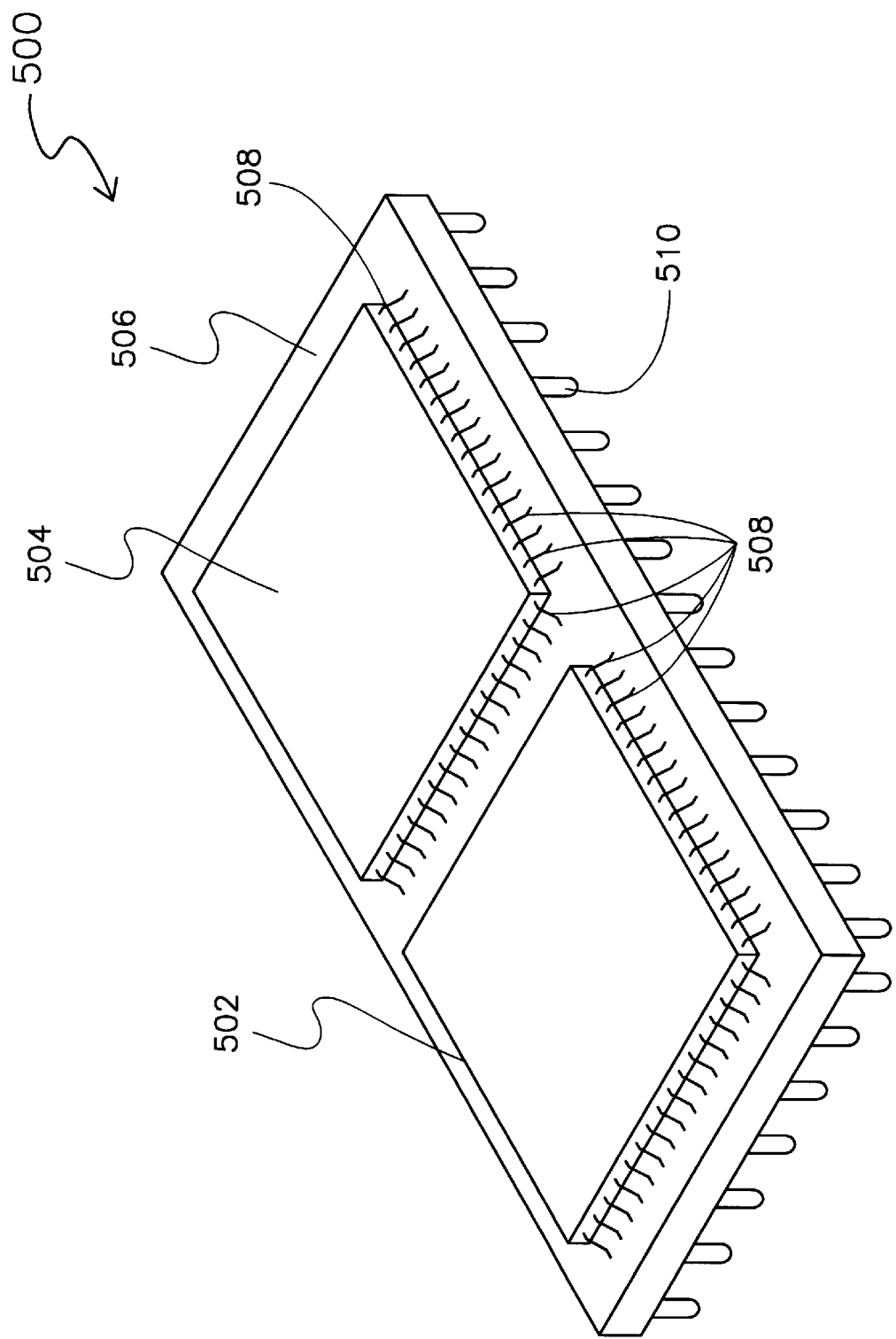
FIG. 5 is a schematic perspective view of a multichip module.

FIG. 5 illustrates a perspective view of a MCM. MCM 500 comprises a substrate 506 having conductive lines formed thereon (not illustrated), at least two semiconductor dies 502 and 504 disposed on the substrate 506 and electrically connected to the substrate 506 conductive lines by the outer tips of lead frame leads 508. The dies 502 and 504 may be physically mounted to the substrate 506 with interposers (not shown) as more fully described hereinabove. The two semiconductor dies 502 and 504 are illustrated encapsulated, however, non-encapsulated flip-chip ball bump dies are also contemplated. One or more layers of conductive traces and plated through-holes (not illustrated) may be disposed within substrate 506 and are used to connect the semiconductor dies 502 and 504 to one another and to external connections 510, such as the solder ball bump-bump structures as described above. Additional electrical components, such as capacitors, resistors and inductors (not illustrated) may also be disposed on and connected to the substrate 506. Numerous other examples, designs and types of MCMs are known to those of skill in the art of semiconductor packages.

A BLP typically includes one or more semiconductor devices (such as a single chip module and/or a multi-chip module), in addition to other components, on one or more printed wiring boards.

Figure 6:
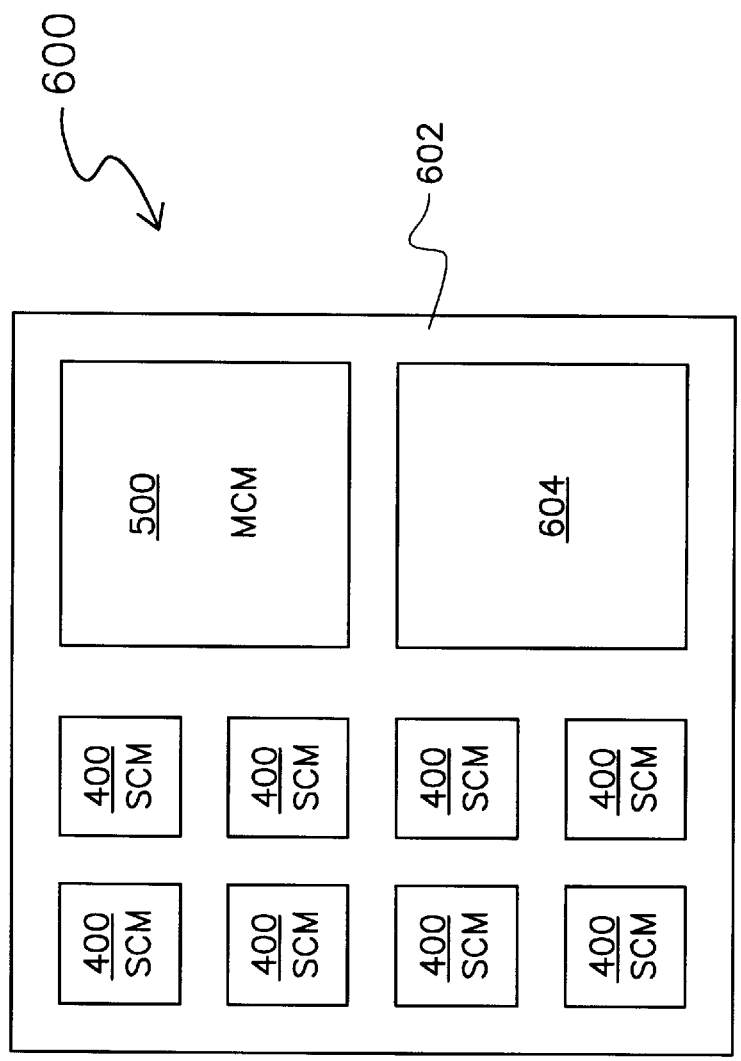
FIG. 6 is a schematic top view of a board level product.

FIG. 6 illustrates a top view of a board level product (BLP). The BLP 600 comprises an array of SCMs 400, a MCM 500, and a memory component 504. The SCMs 400, the MCM 500, and memory 604 are each disposed on and connected to a printed wiring board 602. The printed wiring board 602 provides for all connections between those components. Examples of BLPs include central processing unit boards, memory boards, and interface boards (as are routinely utilized in computer systems).

Boxes are also system level products which may include a combination of SCMs, MCMs, BLPs, and/or other devices. For example, multiple board level products may be connected in parallel with one another by a bus (such as a backplane bus, which is also referred to as a mother board), which communicates signals therebetween. Numerous other examples, designs and types of Boxes are readily apparent to one of ordinary skill in the art. The conductive leads wires exit the boxes, and are usually terminated at external leads or pins.

Other MCM, SCM, mini-board, micro-board, board level and other system sub-assemblies are contemplated using the shaped self-aligned micro-bumps of the present invention. Additionally, such sub-assemblies or packages using such self-aligned micro-bump structures may be used in traditional circuit boards or sub-assemblies for a system level product. Examples of electronic systems that may benefit from the system and method of the present invention have been mentioned above. The spirit and intent of the present invention is to improve the mountability and reliability of, and cost to manufacture all electronic systems from a single semiconductor integrated circuit die to a complex multiple box computing system.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

While the present invention has been depicted, described, and is defined by reference to a particularly preferred embodiment of the invention, such reference does not imply a limitation on the invention, and no such limitation is to be inferred. The invention is capable of considerable modification, alternation, and equivalents in form and function, as will occur to those ordinarily skilled in the pertinent arts. The depicted and described preferred embodiment of the invention is exemplary only, and is not exhaustive of the scope of the invention. Consequently, the invention is intended to be limited only by the spirit and scope of the appended claims, giving full cognizance to equivalents in all respects.

What is claimed is:

1. An electronic system having at least one integrated circuit package, said electronic system comprising:

an integrated circuit package having a die receiving area centrally located in said package;

a lead frame having a plurality of lead frame fingers with first ends thereof proximate the die receiving area and second ends thereof external to said package, the first ends and second ends of said plurality of lead frame fingers defining a peripheral area surrounding the die receiving area;

power and ground busses shaped in two concentric coplanar bus rings, each bus ring proximate to said lead frame and commonly insulated therefrom, said bus rings shaped in a contiguous frame surrounding the die receiving area, the contiguous frame of said power and ground busses disposed within the peripheral area defined by the first ends and second ends of said plurality of lead frame fingers, wherein the first ends of said plurality of lead frame fingers are located between said power and ground busses and the die receiving area of said package;

an integrated circuit die having a plurality of contact pads on a face thereof, said integrated circuit die attached to the die receiving area of said package, wherein some ones of the plurality of contact pads are connected to respective ones of the lead frame fingers near the first ends thereof and some other ones of the plurality of contact pads are connected to said power and ground busses; and said power and ground busses connected to respective other ones of the lead frame fingers.

2. The electronic system of claim 1 wherein a nonconductive film insulates said power and ground busses from said lead frame fingers.

3. The electronic system of claim 2 wherein said power and ground busses are plated or printed on said film.

4. The electronic system of claim 3 wherein said film is adhesively secured to said lead frame fingers.

5. The electronic system of claim 2 wherein said film is polyimide.

6. The electronic system of claim 1, wherein the plurality of contact pads are connected to said lead frame fingers and said power and ground busses by bond wires.

7. The electronic system of claim 1, wherein said power and ground busses carry electrical power to said integrated circuit die.

8. The electronic system of claim 1, wherein said ground buss provides ground connections for said integrated circuit die.

9. The electronic system of claim 1, wherein said electronic system is comprised of a single integrated circuit die module.

10. The electronic system of claim 1, wherein said electronic system is comprised of a multi-integrated circuit die module having at least one integrated circuit package.

11. The electronic system of claim 1, wherein said electronic system is comprised of a board level product having a plurality of integrated circuit packages on at least one printed wiring board.

* * * * *